US 8,867,018 B2

(12) United States Patent
Lu et al.

(10) Patent No.: US 8,867,018 B2
(45) Date of Patent: Oct. 21, 2014

(54) METHOD AND SYSTEM FOR IMPROVED OVERLAY CORRECTION

(75) Inventors: Shin-Rung Lu, Chu-Pei (TW); Tsai-Fu Ou, Toufen Township (TW); Wen-Yao Hsieh, Sanchong (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 841 days.

(21) Appl. No.: 12/617,403

(22) Filed: Nov. 12, 2009

(65) Prior Publication Data

US 2010/0201965 A1 Aug. 12, 2010

Related U.S. Application Data

(60) Provisional application No. 61/151,298, filed on Feb. 10, 2009.

(51) Int. Cl.
G03B 27/68 (2006.01)
G03B 27/32 (2006.01)
G03F 7/20 (2006.01)

(52) U.S. Cl.
CPC ............ *G03B 27/32* (2013.01); *G03F 7/70633* (2013.01)
USPC .......................................................... 355/52

(58) Field of Classification Search
USPC ......................................... 355/72, 77, 53, 52
See application file for complete search history.

(56) References Cited

U.S. PATENT DOCUMENTS

| 5,894,350 | A | 4/1999 | Hsieh et al. | |
|---|---|---|---|---|
| 6,092,031 | A | 7/2000 | Yasuda | |
| 6,251,745 | B1 | 6/2001 | Yu | |
| 6,304,999 | B1 * | 10/2001 | Toprac et al. | 700/121 |
| 6,309,944 | B1 | 10/2001 | Sheng et al. | |
| 6,338,971 | B1 | 1/2002 | Yasuda et al. | |
| 6,865,438 | B1 | 3/2005 | Lin et al. | |
| 7,556,899 | B2 * | 7/2009 | Ikeda et al. | 430/22 |
| 7,618,755 | B2 * | 11/2009 | Schulze et al. | 430/30 |
| 8,112,168 | B2 * | 2/2012 | Ramavajjala et al. | 700/105 |
| 2002/0111038 | A1 * | 8/2002 | Matsumoto et al. | 438/763 |
| 2003/0115556 | A1 * | 6/2003 | Conrad et al. | 716/4 |
| 2004/0015256 | A1 * | 1/2004 | Conrad et al. | 700/121 |
| 2006/0064194 | A1 * | 3/2006 | Lee | 700/121 |

(Continued)

OTHER PUBLICATIONS

Hawkins, A., et al., "Contact Photolithographic Alignment Tutorial," Electrical and Computer Engineering Department, Brigham Young University, Jan. 2004, pp. 1-9.

*Primary Examiner* — Peter B Kim
*Assistant Examiner* — Deoram Persaud
(74) *Attorney, Agent, or Firm* — Slater and Matsil, L.L.P.

(57) ABSTRACT

A method for improving alignment in a photolithography machine is provided. The method comprises identifying first empirical alignment data that has been determined from use of a target photomask within at least one non-target tool, and identifying second empirical alignment data that has been determined from use of a non-target photomask within a target tool. The method continues by identifying third empirical alignment data that has been determined from use of a non-target photomask within at least one non-target tool, and calculating from the first, second, and third empirical alignment data a predicted alignment data for the target photomask with the target tool. The method then proceeds by aligning the target photomask within the target tool using the predicted alignment data, exposing a pattern from the target photomask onto the wafer in the target tool, and further processing the exposed wafer.

19 Claims, 4 Drawing Sheets

(56) References Cited

U.S. PATENT DOCUMENTS

| | | |
|---|---|---|
| 2007/0121093 A1* | 5/2007 | Lin ................................ 355/77 |
| 2008/0057418 A1* | 3/2008 | Seltmann et al. ............... 430/30 |
| 2008/0073589 A1* | 3/2008 | Adel et al. ............... 250/492.22 |
| 2010/0028790 A1* | 2/2010 | Seltmann et al. ............... 430/30 |
| 2010/0185311 A1* | 7/2010 | Hsieh et al. ..................... 700/99 |

* cited by examiner

| MASK | TOOL | | |
|---|---|---|---|
| | A | B | C |
| MA | YES | YES | YES |
| MB | YES | YES | YES |
| MC | YES | NO | YES |
| MD | YES | NO | YES |
| ME | YES | YES | YES |

MASK DATABASE

103 →

TOOL DATABASE

| TOOL | MASK | | | | |
|---|---|---|---|---|---|
| | MA | MB | MC | MD | ME |
| TA | TOOL TA | TOOL TA | TOOL TA | N/U | TOOL TA |
| | TOOL TB | N/U | N/U | N/U | N/U |
| | N/U | TOOL TC | N/U | TOOL TC | N/U |
| TB | N/U | N/U | N/U | N/U | N/U |
| | N/U | TOOL TB | N/U | N/U | N/U |
| | TOOL TC | TOOL TC | N/U | N/U | TOOL TC |
| TC | N/U | TOOL TA | TOOL TA | TOOL TA | TOOL TA |
| | N/U | TOOL TB | TOOL TB | N/U | TOOL TB |
| | TOOL TC | N/U | TOOL TC | TOOL TC | N/U |

104 →

ALIGNMENT DATA DATABASE

| MASK TYPE | TOOL A,B,C, COMBINATION | | | | | | | | |
|---|---|---|---|---|---|---|---|---|---|
| | TA to TA | TA to TB | TA to TC | TB to TA | TB to TB | TB to TC | TC to TA | TC to TB | TC to TC |
| MASK MA | 10 | | | 15 | Y | | | 20 | 25 |
| MASK MB | 25 | | 5 | | 20 | 5 | 25 | -15 | |
| MASK MC | 10 | | 10 | 5 | -15 | 10 | | | -10 |
| MASK MD | | | 15 | | -25 | | -20 | | 5 |
| MASK ME | | | 20 | | 10 | 15 | | 25 | |

EXAMPLE TABLE

| TOOL COMBINATION | OVERLAY CORRECTION VALUE FOR CURRENT MASK | MASKS COMMON TO BOTH TOOL COMBINATIONS | CURRENT TOOL COMBINATION OVERLAY CORRECTION | TOOL COMBINATION OVERLAY CORRECTION | OFFSET | AVERAGE OFFSET | WEIGHTED OVERLAY CORRECTION | PREDICTED OVERLAY CORRECTION |
|---|---|---|---|---|---|---|---|---|
| TA to TA | 10 | MASK MB | 20 | 25 | -5 | -15 | -5 | 6.875 |
|  |  | MASK MC | -15 | 10 | -25 |  |  |  |
| TB to TA | 15 | MASK MC | -15 | 5 | -20 | -20 | -5 |  |
| TC to TB | 20 | MASK MB | 20 | -15 | 35 | 10 | 30 |  |
|  |  | MASK ME | 10 | 25 | -15 |  |  |  |
| TC to TC | 25 | MASK MC | -15 | -10 | -5 | -17.5 | 7.5 |  |
|  |  | MASK MD | -25 | 5 | -30 |  |  |  |

FIG. 1C

METHOD AND SYSTEM FOR IMPROVED OVERLAY CORRECTION

This application claims the benefit of U.S. Provisional Application No. 61/151,298, filed on Feb. 10, 2009, entitled "Method and System for Improved Overlay Correction," which application is hereby incorporated herein by reference.

TECHNICAL FIELD

The present invention relates generally to a system and method for improved overlay correction, and more particularly to a system and method for predicting and compensating for variations in leading lot overlay.

BACKGROUND

Modern photolithographic semiconductor fabrication processes produce integrated circuits on a semiconductor wafer by building up patterns in a successive series of layers. A layer is created by exposing light through a photomask to impinge upon a photoresist layer on the wafer. The wafer is then treated with a chemical to remove selected portions of the resist corresponding to the pattern exposed through the photomask. As part of the pattern creation process, the wafer often moves from one photolithography machine to another for the creation of successive layers.

In order to ensure that a working integrated circuit results from the photolithography process various elements within each photolithographic machine, a chuck holding a wafer, and a mask holder holding a mask, must be aligned to ensure each created layer is in the appropriate position in relation to the previous layer. This is overlay, the superposition of a pattern on the surface of a semiconductor device onto a previously etched pattern. Generally, some level of misalignment occurs between the layers during the production process. Overlay control attempts to monitor and correct misalignment between layers on a multi-layer device structure, such as a semiconductor.

Modern overlay control methods model and compensate for inter term misalignment and intra term misalignment. Inter term misalignment is introduced by the photolithographic machine as the wafer is moved from one photolithography machine to another photolithography machine. These photolithographic machine contributions to inter term misalignment include, but are not limited to, variations caused by wafer translation, wafer rotation, and wafer expansion. Intra term misalignment is introduced by the above described contributions of the photolithographic machine and the photomask used to create the layer. These photomask contributions to intra term misalignment include, but are not limited to, mask translation, mask rotation, and mask magnification.

One of the most difficult areas to correct misalignment involves leading lots, the initial group of wafers produced with a photomask and photolithographic machine combination. Processes that attempt to correct misalignment in the leading lot are only able to correct for misalignment caused by the same photolithographic machine, layer, and technology combination used within about the prior 180 days. This is due to the limited amount of historical data that is typically maintained. These processes only correct for misalignment caused by photolithographic machine contributions and not misalignment introduced by the photomask. Consideration of only photolithographic machine contributions to misalignment allows for accurate correction of misalignment in non-leading lots where there is prior experience for the photomask and photolithographic machine combination. Unfortunately, with leading lots there is no prior experience upon which to draw to ensure correct alignment for the leading lot photomask and photolithographic machine combination. Therefore, there is a need for a system and/or method for improved compensation for leading lot overlay that addresses at least some of the problems and disadvantages associated with conventional methods.

SUMMARY OF THE INVENTION

These and other problems are generally solved or circumvented, and technical advantages are generally achieved, by various embodiments of the present invention which provide a system and method for predicting and compensating for variations in leading lot overlay.

In accordance with an illustrative embodiment of the present invention, a method of photolithographically exposing a wafer using a target photomask within a target tool is provided. The method comprises identifying first empirical alignment data that has been determined from use of the target photomask within at least one non-target tool, and identifying second empirical alignment data that has been determined from use of a non-target photomask within the target tool. The method continues by identifying third empirical alignment data that has been determined from use of the non-target photomask within at least one non-target tool, and calculating from the first, second, and third empirical alignment data a predicted alignment data for the target photomask with the target tool. The method then proceeds by aligning the target photomask within the target tool using the predicted alignment data, exposing a pattern from the target photomask onto the wafer in the target tool, and further processing the exposed wafer.

In accordance with an illustrative embodiment of the present invention, a method for improving alignment of a photolithography machine is provided. The method comprises identifying a current mask used with a current tool to expose a wafer, and identifying a current tool combination by identifying a prior tool used to expose the wafer. The method continues by identifying tools using the current mask within a time period. For each instance of the use of a current mask on a tool, the method further comprises identifying a tool combination by identifying a prior tool used to create the previous layer, identifying alignment correction values associated with the tool combinations, identifying masks common to each tool combination and the current tool combination, and identifying alignment correction values associated with each common mask. The method further comprises determining common mask offset values, determining an average tool combination offset value for each tool combination, determining a weighted alignment correction value for each tool combination, and determining a predicted alignment correction value for the current combination. The method then adjusts the photolithography machine according to the predicted alignment correction value.

In accordance with another illustrative embodiment, a system for improving alignment of a photolithography machine is provided. The system comprises a machine control workstation coupled to a photolithography machine, the photolithography machine having adjustment mechanisms for adjusting the alignment of a mask, and a wafer. The machine control workstation controls the adjustment mechanisms, and the machine control workstation has an overlay correction module.

An advantage of an illustrative embodiment of the present invention is that the present method and system considers error introduced by both the photolithographic machine (tool)

and the photomask (mask) used in the leading lot. Based on the error introduced by both the tool and the mask, the methods and system of the present invention compensate for misalignment caused by tool contributions and mask contributions, decreasing out of specification errors in the leading lot.

BRIEF DESCRIPTION OF THE DRAWINGS

For a more complete understanding of the present invention, and the advantages thereof, reference is now made to the following descriptions taken in conjunction with the accompanying drawings, in which:

FIG. 1B is an illustration of several components of an illustrative embodiment of the present invention in table format; and FIG. 1C is a table representation of the process disclosed in an illustrative embodiment of the present invention;

DETAILED DESCRIPTION OF ILLUSTRATIVE EMBODIMENTS

The making and using of the present illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a method for improved overlay correction in photolithography semiconductor manufacturing. The invention may also be applied, however, to other processes in which semiconductors are produced, or in which it is necessary to compensate for multiple alignment variables in the production of a product.

Figure 1A:
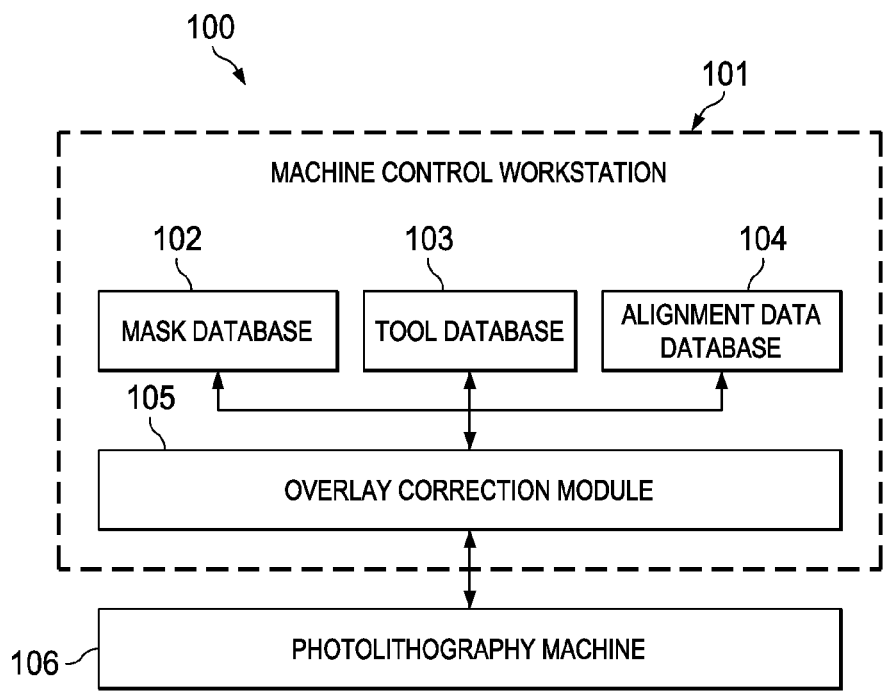
FIG. 1A is a schematic diagram of selected elements of a machine control workstation for improved overlay correction.

With reference now to FIG. 1A, there is shown a schematic diagram illustrating elements of a system 100 for improved overlay correction. Specifically, system 100 comprises a machine control workstation 101 and a photolithography machine 106. Photolithography machine 106 comprises a photolithography machine capable of exposing leading lots with various masks, such as an ASML AT1700 scanner, an ASML/7X0 scanner, and/or a NIKON exposure tool.

In an illustrative embodiment, machine control workstation 101 can take the form of a computer program product accessible from a computer-usable or computer-readable medium providing program code for use by or in connection with a computer or any instruction execution system. For the purposes of this description, a computer-usable or computer-readable medium can be any apparatus or otherwise tangible medium that can contain, store, communicate, propagate, or transport the program for use by or in connection with the instruction execution system, apparatus, or device.

The computer readable medium of machine control workstation 101 can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

In an illustrative embodiment, machine control workstation 101 will include a data processing system suitable for storing and/or executing program code and will include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution.

In the illustrative embodiment, machine control workstation 101 will include input/output or I/O devices (including but not limited to keyboards, displays, pointing devices, etc.) coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

In the illustrated embodiment, machine control workstation 101 comprises a mask database 102, a tool database 103, an alignment data database 104, and an overlay correction module 105. Mask database 102 comprises a storage medium containing information identifying what photolithographic machines (tools) were used with a particular photomask (mask). Tool database 103 comprises a storage medium containing information identifying what tools were used to create the semiconductor wafer layer (layer) prior to use with a particular mask and tool.

Alignment data database 104 comprises a storage medium containing historical empirical alignment data for some period of time, such as the prior 180 days. The empirical alignment data includes overlay correction values of wafers moved from one tool to the same or a different tool for each mask and tool configuration available to system 100.

Overlay correction module 105 comprises a processor containing executable instructions such that overlay correction module 105 can access and manipulate data stored in the previously described databases. Machine control workstation 101 applies the data products of overlay correction module 105 to a tool (such as photolithography machine 106) aligning various elements within the tool for exposure of the leading lot.

The various elements listed above are shown for explanatory purposes only, and a person skilled in the art will understand that the various elements can be embodied in both simpler and more complex systems. The present invention also contemplates the various modules depicted above condensed to a single module of logic circuitry capable of performing the above described tasks.

Overlay alignment may be expressed as a variety of components, such as the translation in x, the translation in y, proper magnification, proper rotation, etc. For example, the x and y components describe the planar distance from a center point at which elements of a tool are aligned. Looking at a wafer positioned on a tool from a top view, the y component describes vertical positioning, and the x component describes horizontal positioning. In the tool described, there are two elements to align, a mask, and a wafer. In order to correctly align the described tool, the system may align the mask in the x and y positions and the wafer in the x and y positions for a proper exposure of each successive layer. A person of ordinary skill in the art will understand that alignment occurs for various variables of the specific machine, which may include additional elements and components. The method and system disclosed herein describe the process of predicting the appropriate overlay correction value for the y position of one element, e.g., a mask or a wafer. A person of ordinary skill in the art will understand that the process will repeat until a predicted overlay correction value for the x, y, magnification and/or rotational components of each element have been determined, as required by the particular tool and mask in use with the system.

In each described step of the operative embodiment, examples will be provided to illustrate the process. Reference will be made to FIG. 1B, which illustrates tables containing illustrative embodiments of mask database 102, tool database 103 and alignment data database 104. Reference will also be made to FIG. 1C, which illustrates an example table containing values determined in intermediate steps of the process.

In the illustrative embodiment of mask database 102, illustrated in FIG. 1B, masks available to system 100 are listed in the rows of the first column of the table; each successive column corresponds to a tool available to system 100. In the illustrated embodiment, the values in mask database 102 were arbitrarily selected to aid in illustration. In an implementation of illustrative embodiments of the present invention, the values in mask database 102 will be determined from prior uses of the available masks with the available tools. Where a particular mask was used with a particular tool, a YES value is stored in the cell at the intersection of that particular mask and that particular tool. Where a particular mask was not used with a particular tool, a NO value is stored in the cell at the intersection of that particular mask and that particular tool.

In the illustrative embodiment of tool database 103, illustrated in FIG. 1B, tools available to system 100 are listed in the rows of the first column of the table; each successive column corresponds to a mask available to system 100. At the intersection of a particular tool and mask are three cells. If a particular tool was used to create the layer formed immediately prior to the use of the particular tool with the current mask, the tool is listed in one of the three cells, otherwise a Not Used value (N/U) fills the cell. In the illustrated embodiment, the values in tool database 103 were arbitrarily selected to aid in illustration. In an implementation of illustrative embodiments of the present invention, the values in tool database 103 will be determined from prior uses of the available tools with the available masks.

In the illustrative embodiment of alignment data database 104, illustrated in FIG. 1B, masks available to system 100 are listed in the rows of the first column of the table, each successive column corresponds to movement of a wafer from a first tool listed in the column to a second tool as identified in the heading prior to exposure with the particular mask. Overlay correction values are listed in each cell of the table. In the illustrated embodiment, the overlay correction values correspond to the alignment correction value of the y component of the wafer for a lot where the prior layer was exposed on the first machine listed in the column, and the subsequent layer was exposed on the second machine listed in the column with the particular mask listed for the row. For example, the overlay correction value for a lot where the prior layer was exposed with on Tool TC, then moved to Tool TA for creation of the subsequent layer with Mask MD was a value of −20. For purposes of the disclosed process the type of layer, i.e., the particular material or function of the layer, created with a particular mask does not effect the alignment, or the alignment values. In the illustrated embodiment, the values in alignment data database 104 were arbitrarily selected to aid in illustration. In an implementation of illustrative embodiments of the present invention, the values in alignment data database 104 will be determined from prior uses of the available tools and the available masks.

A person of ordinary skill in the art will understand that alignment data database 104 includes overlay correction values corresponding to each alignment component, i.e., translation in x, translation in y, magnification and/or rotation, of each element, e.g., a wafer or a mask, to be aligned. Alignment data database 104 may comprise a single database containing overlay correction values, or alignment data database 104 may comprise multiple databases containing overlay correction values for each separate alignment component.

In the illustrative operative embodiment, overlay correction module 105 identifies the current mask in use on photolithography machine 106. For ease of explanation, photolithography machine 106 refers to Tool TB in the tables of FIG. 1B. For example, overlay correction module 105 identifies that the current wafer is to be exposed through Mask MA on Tool TB. Overlay correction module 105 then identifies the tool used to create the previous layer on the current wafer. For example, overlay correction module 105 identifies that the tool used to create the previous layer on the current wafer was Tool TB. Thus, overlay correction values are needed to correctly align Tool TB and Mask MA, when the previous layer was created on Tool TB. As shown in alignment data database 104 of FIG. 1B, the leading lot overlay correction value to be predicted is indicated by the Y value stored at the intersection of the Tool TB to Tool TB column with the Mask MA row. The tool used to create the previous layer on the current wafer is a predefined input for system 100, performed manually or as part of an automated semiconductor manufacturing process.

Overlay correction module 105 then checks mask database 102 identifying all tools that have used the current mask within a defined period of time, such as the prior 180 days, creating a list of prior tools. For example, overlay correction module 105 identifies all tools in mask database 102 that have used Mask MA within the prior 180 days. Referencing mask database 102 of FIG. 1B, Mask MA has been used on Tool TA, Tool TB and Tool TC. The defined period of time is set based upon the historical data available to the system. In the above example, the system may store historical data for a 180 day time period, in alternative embodiments of the invention the time period could be any time period for which the system is able to store data.

In operative embodiments of the invention for each instance of the use of the current mask on a tool, overlay correction module 105 checks tool database 103 to identify the tool used to create the layer formed immediately previous to the use of the current mask with the tool. For example, as described above, Mask MA has been used with Tool TA, Tool TB, and Tool TC. For each of Tool TA, Tool TB, and Tool TC, overlay correction module 105 checks tool database 103 and identifies the tool that was used to create the layer prior to the use of Mask MA with Tool TA, Mask MA with Tool TB, and Mask MA with Tool TC. As shown in tool database 103 of FIG. 1B, Mask MA was used with Tool TA prior to the use of Mask MA with Tool TA, and Mask MA was used with Tool TB prior to the use of Tool TA. Overlay correction module 105 labels these tools as a tool combination. For example, where Tool TA was used prior to the use of Mask MA with Tool TA, the tool combination is Tool TA to Tool TA, or TA to TA. Similarly, where Tool TB was used prior to the use of Mask MA with Tool TA, the tool combination is Tool TB to Tool TA, or TB to TA.

System 100 has now identified the following information: the current tool to be used on the current wafer, the current mask to be used on the current wafer, the tool used to create the previous layer on the current wafer, the tools used with the current mask on other wafers, and for every instance where a tool was used with the current mask, the tool used to create the previous layer prior to use of the current mask with the tool, labeling these two tools as a tool combination.

Overlay correction module 105 checks alignment data database 104 for the overlay correction value used when the wafer was moved from one tool to the next tool for exposure through the current mask. The overlay correction value is the dimensional value used to correctly align an element in a particular dimensional direction for a proper exposure, in the example described herein, the dimensional direction corresponds to the y direction. As shown in alignment data database 104, illustrated in FIG. 1B, overlay correction module 105 identifies an overlay correction value of 10 used when a wafer was moved from Tool TA to Tool TA prior to exposure through Mask MA. Where the wafer was moved from Tool TB to Tool TA prior to exposure through Mask MA, the overlay correction value was 15. Where the wafer was moved from Tool TC to Tool TB prior to exposure through Mask MA, the overlay correction value was 20. Finally, where the wafer was moved from Tool TC to Tool TC prior to exposure through Mask MA, the overlay correction value was 25. Overlay correction module 105 stores the overlay correction values. In the present example, these values are shown in the example table of FIG. 1C.

Overlay correction module 105 checks alignment data database 104 and for each tool combination having an overlay correction value for the current mask, identifies masks used on the tool combination that were also used on the current tool combination. For example, as shown in alignment data database 104, illustrated in FIG. 1B, for the Tool TA to Tool TA (column TA to TA) and Tool TB to Tool TB (column TB to TB) comparison, Mask MB and Mask MC are common masks used on both tool combinations. Overlay correction module 105 identifies the overlay correction values for each common mask and stores those values. For example, where Mask MB is common to both Tool TA to Tool TA (TA to TA) and Tool TB to Tool TB (TB to TB), overlay correction module 105 stores the overlay correction values associated with the common masks. Here, the Mask MB, Tool TA to Tool TA overlay correction value is 25, and the Mask MB, Tool TB to Tool TB overlay correction value is 20. These values are shown in the example table of FIG. 1C.

As the illustrative embodiment of the present invention continues the alignment process, overlay correction module 105 determines the offset value for each common mask. The offset value for each common mask is the difference between the current tool combination overlay correction value for the mask and the tool combination overlay correction value. For example, referencing the example table of FIG. 1C, where Mask MB was common to both the current tool combination (Tool TB to Tool TB) and the tool combination (Tool TA to Tool TA), the offset value is the difference between the overlay correction value of 20 used to correctly align a prior lot when a wafer was moved from Tool TB to Tool TB prior to exposure through Mask MB and the overlay correction value of 25 used to correctly align a prior lot when a wafer was moved from Tool TA to Tool TA prior to exposure through Mask MB, an offset value of −5. This is repeated for each common mask on each identified tool combination. The results are illustrated in the example table show in FIG. 1C.

Overlay correction module 105 then averages the offset values for each tool combination to determine an average offset value for the tool combination. Referencing the example table of FIG. 1C, for the Tool TA to Tool TA tool combination, the average offset value is the average of the offsets for Mask MB and Mask MC masks, a value of −15. This process is repeated for each tool combination; the results appear in the example table of FIG. 1C.

In the illustrative embodiment, overlay correction module 105 adds the average offset value for each tool combination to the overlay correction value for the tool combination with the current mask to determine a weighted overlay correction value. Referencing the example table in FIG. 1C, overlay correction module 105 adds the Tool TA to Tool TA average offset value to the overlay correction value for the Mask MA, Tool TA to Tool TA combination, determining a weighted overlay correction value of −5. This is repeated for each tool combination as shown in the example table of FIG. 1C. Overlay correction module 105 then averages the weighted overlay correction values of each tool combination to determine a predicted overlay correction value for the current mask and the current tool combination. Again, referencing the example table in FIG. 1C, overlay correction module 105 averages the weighted overlay correction values to determine the predicted overlay correction value in the y direction for the Mask MA, Tool TB to Tool TB combination, i.e. the mask and tool combination to be used to expose the leading lot. This value is 6.875. Control workstation 101 applies this predicted overlay correction value to photolithography machine 106, correctly aligning an element, such as the mask, in the y direction. Overlay correction module 105 performs the above described operations for the x direction of the element, the x and y directions of each additional element, as well as any magnification or rotational correction of each element of photolithography machine 106 that must be aligned prior to exposing the leading lot wafer.

A person of ordinary skill in the art will understand that the processes described above will be repeated until a predicted overlay correction value has been determined for every alignment component of the processing tool under consideration, and every alignment component has subsequently been aligned according to the predicted overlay correction value. In addition, in an alternative embodiment, statistical methodologies, such as the mean+/−3σ method, may be incorporated to increase the accuracy of the disclosed method. The statistical methodologies exclude anomalous overlay correction values upon which the predicted overlay correction value is based. In so doing, the statistical methodologies further refine the overlay alignment of the leading lot wafer.

Figure 2:
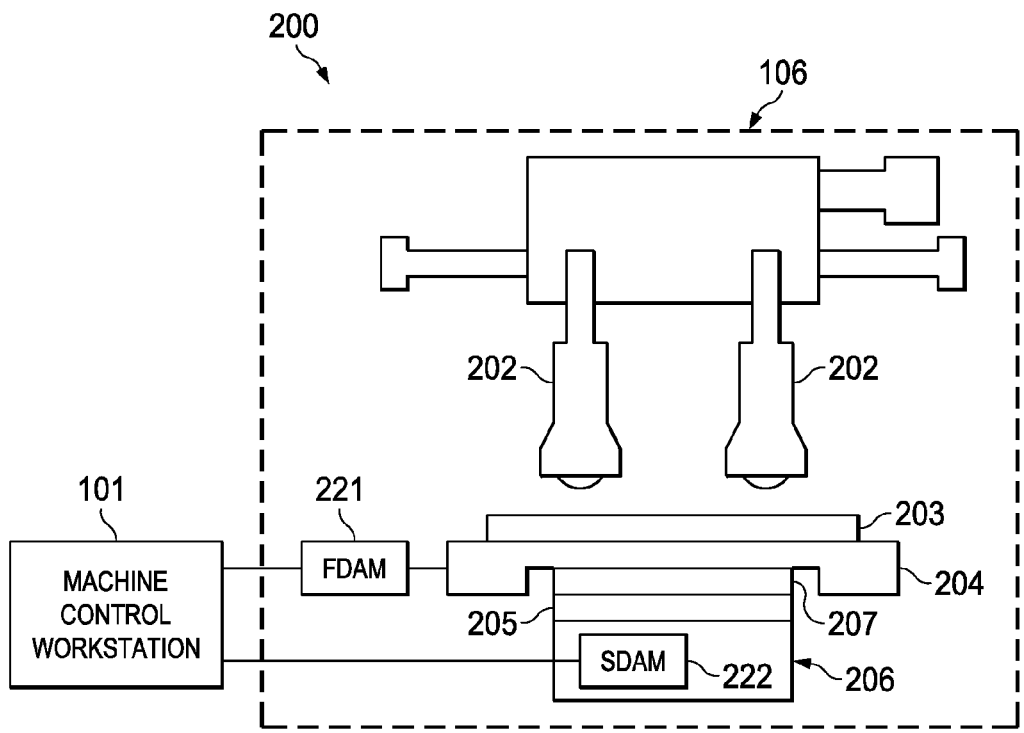
FIG. 2 is a schematic diagram of selected elements of photolithography machine for improved overlay correction in accordance with an illustrative embodiment of the present invention.

FIG. 2 schematically illustrates system 200, and further illustrates the interaction between machine control workstation 101 and photolithography machine 106. As shown in FIG. 2, an illustrative embodiment of photolithography machine 106 comprises a first directional adjustment mechanism 221 (FDAM), a second directional adjustment mechanism 222 (SDAM), a light source 202, a mask 203, a mask holder 204, a lens 207, a wafer 205, and a chuck 206.

In the illustrated embodiment, FDAM 221 comprises a motor, or any other means for adjusting the physical position of mask holder 204, such that mask 203 is correctly aligned. SDAM 222 comprises a motor, or any other means for adjusting chuck 206, such that wafer 205 is correctly aligned. Each of FDAM 221, and SDAM 222 comprises logic circuitry capable of receiving instructions from machine control workstation 101 and performing desired actions in response.

Light source(s) 202 comprises a light source such as an ultraviolet light, used to expose a photoresist on a wafer as a step in the creation of an integrated circuit. Mask 203 comprises a photomask, which allows light from light source 202 to pass through mask 203 in predefined patterns as part of the photolithography process. Mask holder 204 comprises a tool for holding and positioning mask 203. Interposed between mask holder 204 and wafer 205 is a lens 207. Lens 207 translates the pattern from mask 203 to wafer 205, such that light from light source 202 passes through mask 203 and lens 207 onto the desired areas of wafer 205. Wafer 205 comprises a wafer of the type used in the creation of an integrated circuit. In the illustrative embodiment, wafer 205 has been coated in a photoresist reactive to light source 202, such that after exposure to light from light source 202 through mask 203 and lens 207, material may be removed from wafer 205 according to the pattern exposed through mask 203 and lens 207, thus creating a layer as part of the fabrication of an integrated circuit. Chuck 206 comprises a tool used to hold wafer 205 in place, and correctly position wafer 205 for proper exposure to light source 202 through mask 203.

In the illustrative operative embodiment, machine control workstation 101 determines the correct alignment values, through the above described functions, for each dimension of the elements of photolithography machine 106 for the leading lot wafers. Machine control workstation 101 determines the correct overlay shift value for the x and y dimensions of mask holder 204. Machine control workstation 101 then sends a signal to FDAM 221 instructing FDAM 221 to adjust the position of mask holder 204. Machine control workstation 101 also determines the correct overlay shift values for the x and y dimensions of chuck 206. Machine control workstation 101 then sends a signal to SDAM 222 instructing SDAM 222 to adjust the position of chuck 206.

Figure 3:
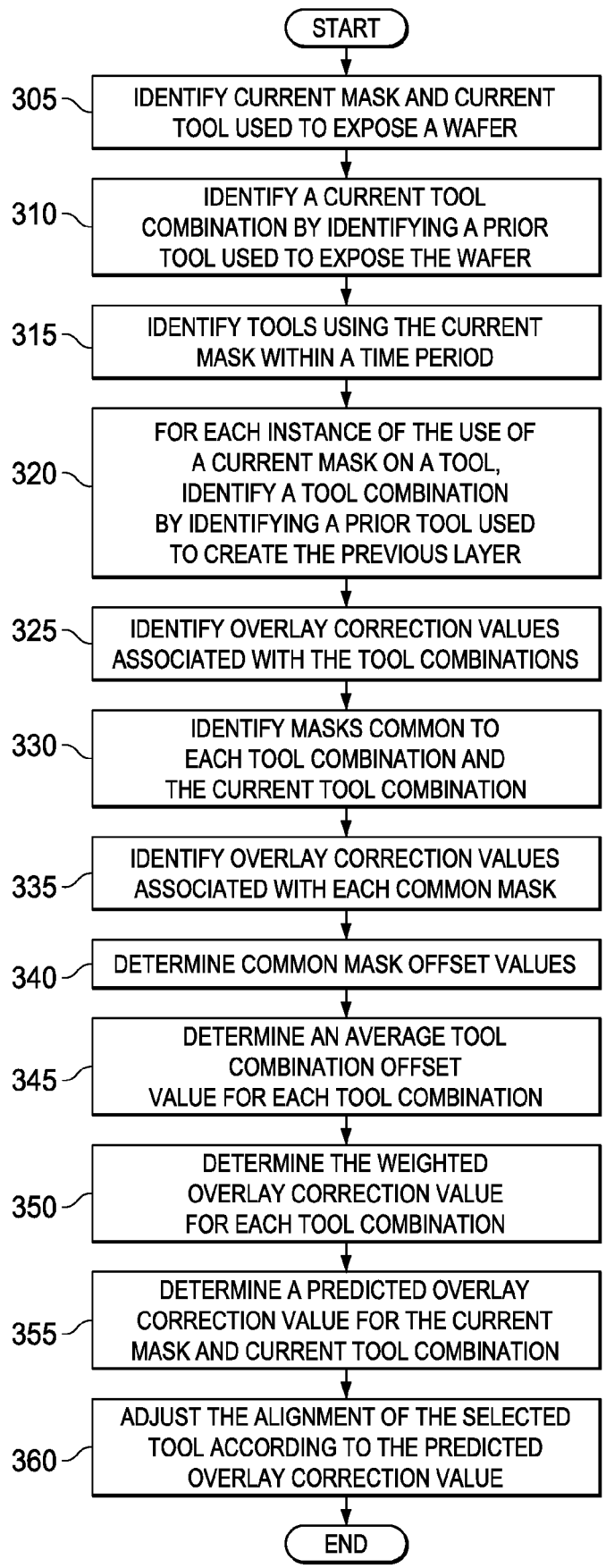
FIG. 3 is a high level flow diagram depicting the operative steps of a method for improved leading lot overlay correction in accordance with an illustrative embodiment of the present invention.

System 100 of FIG. 1A operates as described with respect to FIG. 3. FIG. 3 illustrates a high level flow diagram depicting logical operative steps performed, for example, by system 100 and described above with respect to FIGS. 1A-1C. Examples described below are for reference purposes only, and are not intended to limit the illustrative embodiments of the present invention described above. The logical operative steps described herein may be implemented in accordance with an illustrative embodiment. As indicated at block 305, the process begins when system 100 identifies the current mask and current tool used to expose a wafer. For example, machine control workstation 101 identifies a current mask and a current tool in a process similar to that described above, photolithography machine 106. In an embodiment, this identification could be a user input provided by an operator. Next, as indicated at block 310, system 100 identifies a current tool combination by identifying the tool used to create the previous layer on the wafer. For example, machine control workstation 101 identifies the tool used to create the previous layer on the wafer in a process similar to that previously described. In an embodiment, this identification could be a user input provided by an operator.

Next, as indicated at block 315, system 100 identifies other tools using the current mask within a specified time period. For example, overlay correction module 105 checks mask database 102 and identifies other tools using the current mask within a specified period of time, such as the prior 180 days. Next, as indicated at block 320, for each instance of the use of the current mask on a tool, system 100 identifies a tool combination by identifying the tool used to create the previous layer with the current mask. For example, overlay correction module 105 checks tool database 103 and for each instance of the use of the current mask on another tool, identifies the tool used to create the previous layer with the current mask in a process similar to that previously described.

Next, as indicated at block 325, system 100 identifies overlay correction values for the current mask associated with the identified tool combination. For example, overlay correction module 105 checks alignment data database 104 for the overlay correction values for the current mask associated with the identified tool combination as described above. Next, as indicated at block 330, system 100 identifies masks in common with each previously identified tool combination and the current tool combination. For example, overlay correction module 105 checks alignment data database 104 and identifies masks in common with each previously identified tool combination with the current tool combination.

Next as indicated at block 335, system 100 identifies an overlay correction value for each common mask. For example, overlay correction module 105 checks alignment data database 104 and identifies an overlay correction value for each common mask used with each tool combination and current tool combination. Next, as indicated at block 340, system 100 determines common mask offset values. For example, overlay correction module 105 determines the offset value for each common mask of each tool combination.

Next, as indicated at block 345, system 100 determines the average tool combination offset value. For example, for each previously identified tool combination, overlay correction module 105 determines an average offset value. Next, as indicated at block 350, system 100 determines a weighted overlay correction value for each tool combination. For example, overlay correction module 105 determines a weighted overlay correction value for each tool combination.

Next, as indicated at block 355, system 100 determines a predicted overlay correction value for the current mask and current tool combination. For example, overlay correction module 105 determines a predicted overlay correction value by averaging the weighted overlay correction values. Next, as indicated at block 360, the process ends when system 100 adjusts the alignment of the current tool based on the predicted overlay correction value. For example, machine control workstation 101 adjusts the alignment of photolithography machine 106 according to the predicted overlay correction value.

A person of ordinary skill in the art will recognize that the operations illustrated in block 305 thru block 360 will be repeated until a predicted overlay correction value has been determined for every alignment component of the tool and mask, and the tool and mask have been aligned according to the predicted overlay correction values. One skilled in the art will also recognize that the processing of the wafer will then continue by exposing a photoresist layer on the wafer using proper alignment values.

Accordingly, the disclosed embodiments provide numerous advantages over other methods and systems. Failure due to overlay misalignment in leading lots can be substantially reduced. Furthermore, the method described herein also achieves a decreased overlay rework rate. The present method accomplishes this improvement by considering contributions to misalignment arising from both the exposure tool and the photomask.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of photolithographically exposing a wafer using a target photomask within a target tool comprising:
    identifying first empirical alignment data that has been determined from use of the target photomask within at least one non-target tool;
    identifying second empirical alignment data that has been determined from use of a non-target photomask within the target tool;
    identifying third empirical alignment data that has been determined from use of the non-target photomask within the at least one non-target tool;
    subtracting the third empirical alignment data from the second empirical alignment data, to determine a set of offset values for the non-target tool;
    averaging the set of offset values for the non-target tool to determine an average offset value for the non-target tool;
    calculating predicted alignment data for the target photomask in the target tool from the first empirical alignment data and the average offset value for the non-target tool;
    aligning the target photomask within the target tool using the predicted alignment data;
    exposing a pattern from the target photomask onto the wafer in the target tool; and
    further processing the exposed wafer.

2. The method of claim 1, wherein the first empirical alignment data comprises overlay correction values corresponding to an amount of alignment adjustment required to adjust the at least one non-target tool for use with the target photomask.

3. The method of claim 1, wherein the second empirical alignment data comprises overlay correction values corresponding to an amount of alignment adjustment required to adjust the target tool for use with at least one non-target photomask.

4. The method of claim 1, wherein the third empirical alignment data comprises overlay correction values corresponding to an amount of alignment adjustment required to adjust the at least one non-target tool for use with at least one non-target photomask.

5. The method of claim 1, wherein the calculating predicted alignment data for the target photomask in the target tool from the first empirical alignment data and the average offset value for the non-target tool comprises:
    adding the average offset value for the non-target tool to the first empirical alignment data for the non-target tool to determine fourth empirical alignment data; and
    averaging the fourth empirical alignment data to determine predicted alignment data.

6. A method for improving alignment of a photolithography machine comprising:
    identifying a current mask within a current tool used to expose a wafer;
    identifying a current tool combination by identifying a prior tool used to expose the wafer;
    identifying a plurality of tools that have used the current mask within an historical time period, wherein the plurality of tools comprises at least one tool different from the current tool;
    identifying a tool combination for each of the plurality of tools by identifying a prior tool used to create an immediately previous layer;
    identifying overlay correction values associated with the tool combinations;
    identifying masks common to the current tool combination and each tool combination;
    identifying overlay correction values associated with each common mask;
    determining common mask offset values, wherein the common mask offset values comprise the difference between the overlay correction values for a common mask on the current tool combination and the common mask with each tool combination;
    determining an average tool combination offset value for each tool combination;
    determining a weighted overlay correction value for each tool combination;
    determining a predicted overlay correction value for the current tool combination; and
    adjusting the photolithography machine according to the predicted overlay correction value.

7. The method of claim 6, wherein the identifying a prior tool used to expose the wafer comprises identifying the tool used to create the immediately preceding layer on the wafer.

8. The method of claim 6, wherein the overlay correction values comprise data used to align a wafer and a mask in the photolithography machine.

9. The method of claim 6, wherein the average tool combination offset value for each tool combination comprises the average of all common mask offset values used for each tool combination.

10. The method of claim 6, wherein the weighted overlay correction value for each tool combination comprises a summation of the overlay correction values for the current mask for each tool combination and the average offset value for each tool combination.

11. The method of claim 6, wherein the predicted overlay correction value for the current tool combination comprises an average of the weighted overlay correction values.

12. A system for improving alignment of a photolithography machine comprising:
    a machine control workstation coupled to the photolithography machine;
    the photolithography machine having adjustment mechanisms for adjusting an alignment of a mask and a wafer;
    the machine control workstation coupled to and configured to control the adjustment mechanisms; and
    the machine control workstation having an overlay correction module, wherein the overlay correction module comprises a processor executing instructions for:
        identifying a current mask within a current tool used to expose the wafer;
        identifying a current tool combination by identifying a prior tool used to expose the wafer;
        identifying a plurality of tools that have used the current mask within an historical time period, wherein the plurality of tools comprise at least one non-target tool;

identifying first empirical alignment data determined from the use of the current mask with the at least one non-target tool;
identifying a tool combination for each of the plurality of tools by identifying a prior tool used to create an immediately prior layer;
identifying common masks common to the current tool combination and each tool combination, wherein the common masks comprise at least one non-target mask;
identifying second empirical alignment data that has been determined from use of the at least one non-target mask within the current tool;
identifying third empirical alignment data that has been determined from use of the at least one non-target mask within the at least one non-target tool;
determining common mask offset values, wherein determining the common mask offset value comprises subtracting the third empirical alignment data from the second empirical alignment data;
averaging the common mask offset values to determine an average tool combination offset value for each tool combination;
determining a weighted overlay correction value for each tool combination, wherein determining the weighted overlay correction value comprises adding the first empirical alignment data to the average tool combination offset value for each tool combination; and
determining a predicted overlay correction value for the current tool combination by averaging the weighted overlay correction values.

13. The system of claim 12, wherein the machine control workstation further comprises:

a mask database coupled to the overlay correction module;
a tool database coupled to the overlay correction module; and
an alignment data database coupled to the overlay correction module.

14. The system of claim 13, wherein the mask database comprises a storage medium listing tools using a particular mask.

15. The system of claim 13, wherein the tool database comprises a storage medium listing prior tools used with a mask and tool combination.

16. The system of claim 13 wherein the alignment data database comprises a storage medium containing overlay correction values for mask and tool combinations used within a specified time period.

17. The system of claim 12, wherein the overlay correction module comprises a processor executing instructions for:

identifying overlay correction values associated with the tool combinations;
identifying overlay correction values associated with each common mask.

18. The system of claim 17, wherein the machine control workstation comprises logic circuitry for adjusting the alignment of the photolithography machine in response to the predicted overlay correction values determined by the overlay correction module.

19. The system of claim 17, wherein the machine control workstation comprises a processor executing instructions for adjusting the alignment of the photolithography machine in response to the predicted overlay correction values determined by the overlay correction module.

* * * * *